United States Patent [19]
Cocita

[11] Patent Number: 5,955,949
[45] Date of Patent: Sep. 21, 1999

[54] LAYERED STRUCTURE FOR A TRANSPONDER TAG

[75] Inventor: Keith Cocita, San Jose, Calif.

[73] Assignee: X-Cyte, Inc., San Jose, Calif.

[21] Appl. No.: 08/914,286

[22] Filed: Aug. 18, 1997

[51] Int. Cl.⁶ .................................................. G08B 13/14
[52] U.S. Cl. ................................. 340/572.1; 310/313 R; 342/42; 342/44; 342/51; 343/795
[58] Field of Search .............................. 340/572, 825.34, 340/825.54, 693; 29/855, 854; 257/704; 310/313 R, 313 B, 340, 344, 346, 325, 345, 347; 343/873, 795, 794, 802, 818, 820, 793, 799; 342/42, 44, 51, 58; 156/213, 308.4; 333/186, 193

[56] References Cited

U.S. PATENT DOCUMENTS 5,095,240  3/1992  Nysen et al. ......................... 340/313 R
5,528,222  6/1996  Moskowitz et al. ..................... 340/572
5,699,027  12/1997  Tsuji et al. .............................. 333/193
5,712,523  1/1998  Nakashima et al. ................ 310/313 R
5,779,839  7/1998  Tuttle et al. ............................ 156/213
5,786,626  7/1998  Brady et al. ............................ 257/673

*Primary Examiner*—Benjamin C. Lee
*Attorney, Agent, or Firm*—Milde, Hoffberg & Macklin, LLP

[57] ABSTRACT

A transponder antenna is carried by a substrate and is sandwiched between the substrate and a cover sheet. A rectangular opening extends through the cover sheet and receives a signal processing chip adhesively carried in a recess below a cap which covers the opening. The chip is spaced with respect to the antenna so as to facilitate direct or inductive coupling between the chip and antenna. The cap has a protective portion which extends through the cover opening substantially all the way to the substrate so as to prevent accidental contact between the chip, on one hand, and the substrate and/or antenna on tee other.

4 Claims, 2 Drawing Sheets

LAYERED STRUCTURE FOR A TRANSPONDER TAG

CROSS-REFERENCE TO RELATED APPLICATION

This invention related to U.S. patent application Ser. No. 08/636,903, filed Apr. 10, 1996 (now U.S. Pat. No. 5,654,693).

BACKGROUND OF THE INVENTION-FIELD OF APPLICATION

The present invention relates to transponders, and, more particularly, to the structure of transponders or "tags" which comprise, as a minimum, a substrate, an antenna arranged on the substrate and a signal processing chip (preferably a surface acoustic wave or "SAW" device) coupled to the antenna.

Transponder tags of the aforementioned type receive an interrogating signal from a remote transmitter; process that interrogating signal to generate a reply signal; and transmit the reply signal to a receiver and decoder which receives the transponder generated reply signal and decodes that reply signal for further use. Each transponder is provided with unique encoded information that is incorporated into the reply signal. Such transponders are generally referred to as "passive" because they do not carry a self-contained power source, such as a battery, that must be replaced from time to time. Transponders of this type are described in U.S. Pat. No. 4,725,841 for "System For Interrogating A Passive Transponder Carrying Phase-Encoded Information"; U.S. Pat. No. 5,095,240 for "Inductively Coupled SAW Device And Method For Making The Same"; U.S. Pat. No. 4,737,789, for "Inductive Antenna Coupling for a Surface Acoustic Wave Transponder", and U.S. Pat. No. 4,951,057 for "Inductive Input/Output Coupling for a Surface Acoustic Wave Device". These transponders are used, for example, as personnel identification tags and for vehicle identification on highways and parking lots.

The U.S. patent application Ser. No. 08/636,903 (now allowed) discloses a layered structure for a transponder tag of this type which is simple to manufacture and assemble. The entire disclosure of this U.S. patent application Ser. No. 08/636,903 is incorporated herein by reference. The transponder tag, as disclosed therein, sandwiches an antenna between a cover sheet and substrate and provides an opening through the cover sheet to receive a signal processing chip (e.g., a SAW device) disposed beneath a cap so as to be coupled to the antenna, either directly or indirectly.

The signal processor chip is adhesively secured beneath the cap which is, in turn, secured to the top the cover sheet. The cover is fabricated with a rectangular opening that receives the signal processing chip.

According to a further aspect of this prior disclosure, an antenna is provided on a first surface of a substrate and sandwiched between the substrate and a cover. The rectangular opening which extends through the cover receives the signal processing chip adhesively secured beneath the cap so that the chip is spaced from, but is inductively coupled to the antenna.

This layered transponder structure requires that the substrate at the base of the transponder tag be relatively rigid. Otherwise, the substrate may be pressed upward during normal use and come in contact with the active area of the signal processing chip.

SUMMARY OF THE INVENTION

It is a principal object of this invention to provide a new and novel layered structure for a transponder tag which does not require a rigid substrate.

It is a particular object of the present invention to improve the configuration of a transponder tag of the aforesaid type by providing the tags with a thin, flexible substrate.

These objects, as well as other objects which will become apparent in the discussion that follows, are achieved, in accordance with the present invention, by providing the cap with a protective portion that extends through the cover opening substantially all the way to the substrate. This protective portion acts as a "stop" to prevent the substrate and antenna from flexing upward and making accidental contact with the chip.

As a result of the invention, the substrate, as well as the cap, can be made of a flexible material, and can therefore be made substantially thinner than was possible with the prior known transponder tag.

Other objects, features and advantages of the invention in its details of construction and arrangement of parts will be seen from the above and from the following description of the preferred embodiment when considered with the appended claims.

DESCRIPTION OF THE PREFERRED EMBODIMENTS

Figure 1:
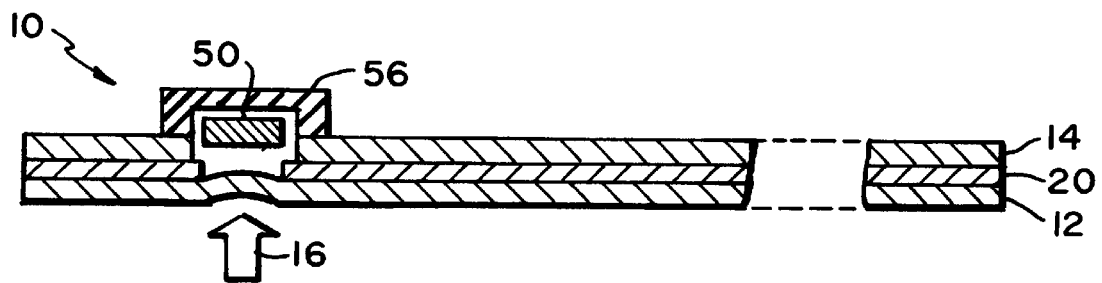
FIG. 1 is a vertical sectional view of a transponder tag of the type disclose in the aforementioned U.S. patent application Ser. No. 08/636,903.

With reference to FIG. 1, there is generally shown at 10 a transponder "tag" of the type known in the prior art which includes a substrate 12 and a cover or cover sheet 14. Substrate 12 and cover 14 are each fabricated from materials conventionally utilized for such components in transponder tags such as FR-4 plastic or a similar substance utilized for printed circuit boards. In particular, the substrate 12 must be made relatively rigid to prevent its bending upward (as shown in the drawing) due to application of a force 16.

An antenna 20 of the type and configuration utilized for transponder tags is conventionally applied to a top surface of the substrate 12 and may be fabricated from suitable material such as aluminum applied as a foil.

Cover sheet 14 is sized and configured to be applied over antenna 20 so that antenna 20 is sandwiched between the bottom surface of the cover 14 and top surface of the substrate 12. Cover sheet 14 and substrate 12 are thus suitably and conventionally attached.

An opening is formed through cover sheet 14 at a location to align with an opening formed in the antenna 20 to provide suitable inductive coupling of antenna 20 with a signal processing chip 50 secured by a suitable adhesive within a plastic cap 56. The chip 50 is preferably a surface acoustic wave (SAW) device of the type described in the aforementioned U.S. Pat. Nos. 4,725,841 and 5,095,240. The cap 56 is sized so that when c/hip 50 is secured within it an air gap 60 is provided between the lower surface of thee chip 50 and the upper surface of the antenna 20. When the signal processing chip 50 is positioned in this manner with respect to antenna 20, proper inductive coupling is provided between the chip 50 and antenna 20.

Alternatively, the chip 50 may be directly electrically coupled to the antenna for wire bonding or the like.

Figure 2:
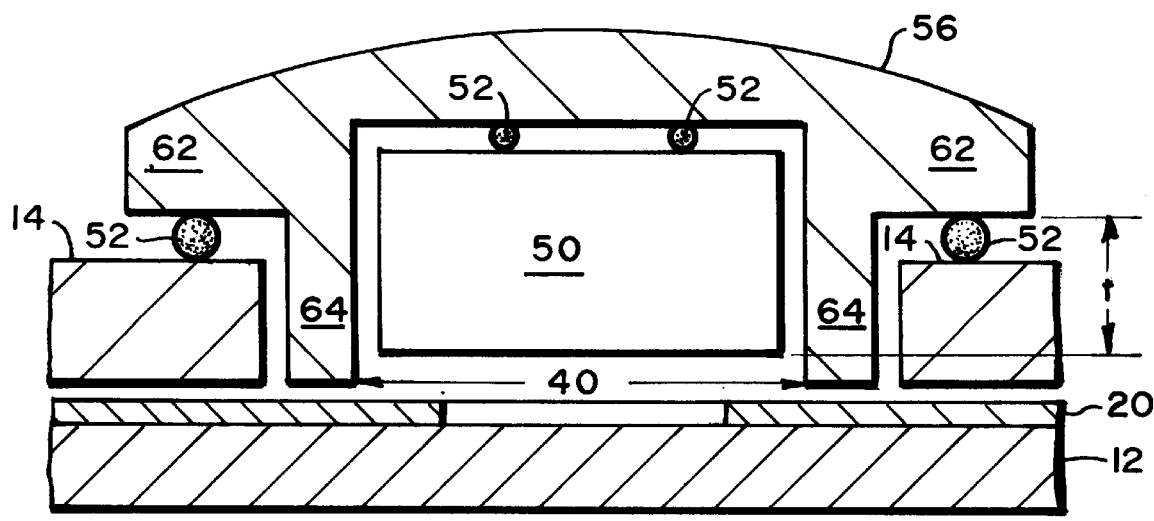
FIG. 2 is an enlarged vertical sectional view of a portion of the transponder tag according to the invention, showing the components thereof as they would appear assembled together.

FIG. 2 illustrates the layered structure according to a preferred embodiment of the present invention. Starting from the bottom, the layered structure comprises an antenna substrate 12 with a transponder antenna 20 disposed on its top surface. A cover 14 is arranged over the antenna and has an opening 40 therein to receive a chip. The cover preferably has a thickness of 0.011 inches. The signal processing chip 50 may have a thickness of 0.020 inches. This chip is spaced with respect to the antenna by a distance in the range of 0.002 inches –0.004 inches.

Depending upon the lateral dimensions of the chip 50, the cover may have a rectangular opening of 0.250 inches× 0.360 inches.

The cap 56 is configured with a recess 54 and a ridge 62 surrounding the recess such that the chip extends downward through the opening 40 a distance "t" of approximately 0.009 inches. This dimension assumes the insertion of a 0.002 inch layer of adhesive 52 between the cap 56 and the cover layer 14.

Figure 3:
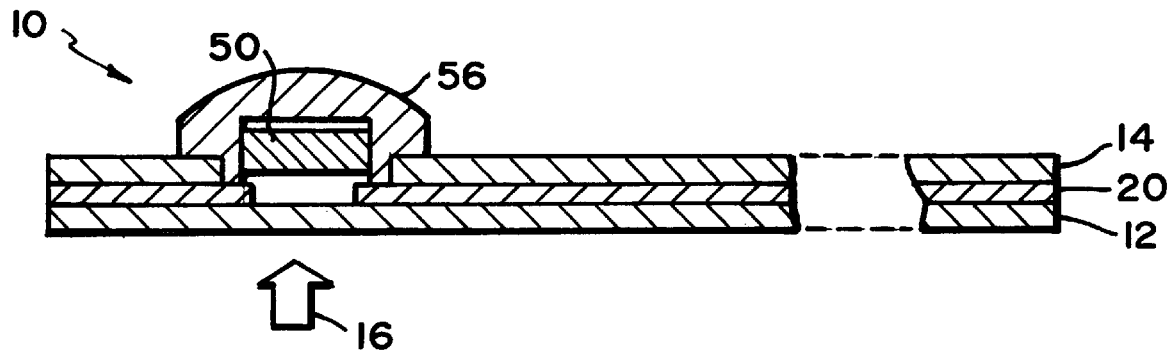
FIG. 3 is a vertical sectional view, similar to FIG. 1, of a transponder tag incorporating in the present invention.

According to the invention, the cap 56 is provided with a protective portion 64 that surrounds the chip and extends downward substantially all the way to the antenna 20 and substrate 12. With this protective portion in place, the substrate 12 can be made of flexible material such as a thin plastic sheet. The antenna 20, which is formed of aluminum foil, is also flexible; however, a force 16 which is applied against the substrate 12 as shown in FIG. 3 will not be able to bring the substrate 12 and/or antenna 20 into contact with the lower surface of the chip 50.

Consequently, the protective portion of the cap prevents accidental contact between the chip, on the one hand, and the substrate and/or antenna, on the other, while the transponder is in use.

Figure 4:
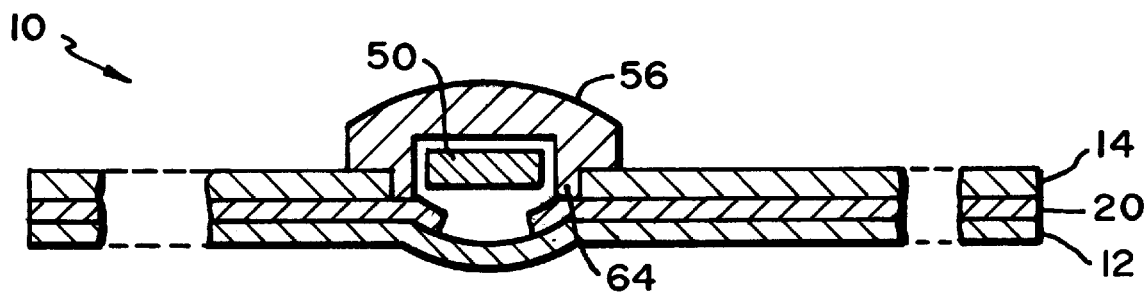
FIG. 4 is a vertical sectional view of a transponder tag according to an alternative embodiment of the present invention.

FIG. 4 illustrates another embodiment wherein the protective portion 64 of the cap 56 presses downward, forcing an outward bulge in the substrate 12. This embodiment insures that the substrate 12 and antenna 20 are maintained a safe distance away from the active surface of the chip 50.

Once assembled, the substrate, antenna and cover layer portion of the transponder tag will have the configuration of a thick "playing card". The cap will extend outward from this card-like structure an additional 0.015 inches. With the exception of the cap portion, the transponder tag is sufficiently thin to follow the industry standard for a bar coded card or a card with a magnetic stripe, while still serving as a transponder tag that may be read at a distance from 0.5 feet to 30 feet, depending upon the application.

The opening formed through cover sheet 14 may be located in position to receive the chip 50 for the above described ccaction with antenna 20 as shown in FIG. 3 of the aforementioned U.S. patent application Ser. No. 08/636,903.

A similarly configured opening may be provided for a cover sheet for use with a transponder tag wherein the chip 50 is centrally located on the tag as shown in FIG. 4 of the aforementioned U.S. patent application Ser. No. 08/636,903. The cover otherwise receives a cap and chip similar to that shown in FIG. 2 for coaction with an antenna carried by a substrate.

From the above description it will thus be seen that there has been provided a new and novel structure for a transponder tag. It is understood that although there has been described the preferred embodiments of the invention, various modifications may be made in the construction and fabrication thereof without departing from the spirit of the invention as comprehended by the following claims.

What is claimed is:

1. A transponder tag, comprising in combination:
    (a) a substrate for carrying transponder components and being formed to a predetermined size and configuration and with at least a first surface;
    (b) a transponder antenna for receiving and transmitting signals and disposed on said first surface of said substrate;
    (c) a cover arranged over said first surface and covering said antenna and having at least one opening extending therethrough;
    (d) a cap having a ridge thereon for covering said cover opening and having a protective portion which extends through said cover opening substantially all the way to said substrate; and
    (e) signal processing chip carried under said cap and arranged in said cover opening within said protective portion of said cap and coupled to said antenna means, whereby said protective portion of said cap prevents accidental contact between said chip on one hand and said substrate and said antenna on the other.

2. The transponder tag of claim 1, wherein said chip is carried by said cap so as to be spaced from said antenna but still inductively coupled to said antenna.

3. The transponder tag of claim 1, wherein said substrate and said antenna are made of flexible sheet material.

4. The transponder tag of claim 3, wherein said cover is made of flexible sheet material.

* * * * *